(12) United States Patent
Mochida et al.

(10) Patent No.: US 8,208,324 B2
(45) Date of Patent: Jun. 26, 2012

(54) SEMICONDUCTOR MEMORY DEVICE THAT CAN RELIEF DEFECTIVE ADDRESS

(75) Inventors: Noriaki Mochida, Tokyo (JP); Kyoichi Nagata, Tokyo (JP)

(73) Assignee: Elpida Memory, Inc., Chuo-ku, Tokyo (JP)

( * ) Notice: Subject to any disclaimer, the term of this patent is extended or adjusted under 35 U.S.C. 154(b) by 254 days.

(21) Appl. No.: 12/654,202

(22) Filed: Dec. 14, 2009

(65) Prior Publication Data

US 2010/0149894 A1 Jun. 17, 2010

(30) Foreign Application Priority Data

Dec. 15, 2008 (JP) ................................ 2008-317890

(51) Int. Cl.
*G11C 29/00* (2006.01)
*G11C 7/06* (2006.01)
*G11C 8/00* (2006.01)
(52) U.S. Cl. .................... 365/200; 365/205; 365/230.03
(58) Field of Classification Search .................. 365/200, 365/205, 230.3
See application file for complete search history.

(56) References Cited

U.S. PATENT DOCUMENTS

| | | | | |
|---|---|---|---|---|
| 6,122,207 A * | 9/2000 | Koshikawa et al. | ........... | 365/200 |
| 6,442,078 B1 * | 8/2002 | Arimoto | ................ | 365/189.08 |
| 6,700,816 B2 * | 3/2004 | Takahashi et al. | ....... | 365/185.07 |
| 6,707,730 B2 | 3/2004 | Mori et al. | | |
| 6,894,940 B2 * | 5/2005 | Kono et al. | ................ | 365/205 |
| 7,304,900 B2 | 12/2007 | Shibata et al. | | |
| 7,542,359 B2 | 6/2009 | Shibata et al. | | |
| 2008/0068918 A1 | 3/2008 | Nishioka | | |
| 2009/0168572 A1 | 7/2009 | Shibata et al. | | |

FOREIGN PATENT DOCUMENTS

| | | |
|---|---|---|
| JP | 2002-298596 | 10/2002 |
| JP | 2004-158069 | 6/2004 |
| JP | 2006-268970 | 10/2006 |
| JP | 2008-71407 | 3/2008 |

* cited by examiner

*Primary Examiner* — Hoai V Ho
*Assistant Examiner* — Tri Hoang
(74) *Attorney, Agent, or Firm* — McGinn IP Law Group, PLLC

(57) ABSTRACT

To comprise a memory cell array, a read amplifier that is provided outside the memory cell array and amplifies data read from the memory cell array, a write amplifier that is provided outside the memory cell array and amplifies data to be written in the memory cell array, and a relief storage cell that is provided outside the memory cell array and connected to an input terminal of the read amplifier and an output terminal of the write amplifier via a switch. With this configuration, a timing of operating a main amplifier and the relief storage cell does not need to be changed depending on a position of a memory block. Further, the number of components required for connecting to the relief storage cell can be minimized.

12 Claims, 9 Drawing Sheets

SEMICONDUCTOR MEMORY DEVICE THAT CAN RELIEF DEFECTIVE ADDRESS

BACKGROUND OF THE INVENTION

1. Field of the Invention

The present invention relates to a semiconductor memory device, and more particularly relates to a semiconductor memory device that can relieve bit defects generated sporadically.

2. Description of Related Art

Memory capacities of semiconductor memory devices such as DRAM (Dynamic Random Access Memory) have been increased year by year according to improvements in microfabrication technology. However, as downscaling of semiconductor memory devices improves, the number of defective memory cells per chip has been increased. Such defective memory cells are replaced by redundant memory cells, so that defective addresses are relieved.

Normally, defective addresses are stored in a fuse circuit including a plurality of program fuses and when an access to a corresponding address is requested, not a defective memory cell but a redundant memory cell is accessed by the control of the fuse circuit. The defective addresses are detected in screening tests performed in a wafer state, and a laser beam is irradiated according to the detected defective addresses, thereby the program fuses are cut.

However, even after performing such address replacement, defective bits may be generated sporadically due to thermal stresses during packaging, for example. When defective bits are found after packaging, the address replacement using laser beam irradiation cannot be performed and thus the defective devices have to be handled as defective products.

As a method for solving such a problem, there has been proposed a method of providing a defect relief circuit capable of relieving a small number of defective bits found after packaging in addition to address replacement utilizing laser beam irradiation. With this method, as for the circuit that stores defective addresses, not a fuse circuit requiring laser beam irradiation but an electrically writable non-volatile memory circuit is used. For such a memory circuit, a so-called "anti-fuse circuit" that utilizes dielectric breakdown of oxide films can be used.

The number of defective bits found after packaging is much smaller than the number of defective bits found during a selection test. Therefore, not word line-by-word line or bit line-by-bit line basis replacement but bit-by-bit replacement is preferably performed. Devices described in Japanese Patent Application Laid-open Nos. 2002-298596, 2008-71407, 2004-158069, and 2006-268970 are known as a semiconductor memory device capable of relieving sporadic bit defects.

The semiconductor memory device described in Japanese Patent Application Laid-open No. 2002-298596 is a DRAM, and relief storage cells formed of SRAM cells are arranged in a sense amplifier array included in a memory cell array, thereby relieving sporadic bit defects.

The semiconductor memory device described in Japanese Patent Application Laid-open No. 2008-71407 is also a DRAM, and a relief storage cell is connected to an output terminal of a read amplifier and an input terminal of a write amplifier, thereby relieving sporadic bit defects.

In Japanese Patent Application Laid-open No. 2008-71407, a relief circuit is arranged to be in parallel with a main amplifier (150) that reads data of a regular memory cell (110) in a preceding stage of an input/output circuit (FIFO circuit) connected to an external data terminal (FIG. 1). Further, the relief circuit is arranged to be in parallel with a write amplifier WB that writes data in the regular memory cell (110) (FIG. 3).

In Japanese Patent Application Laid-open No. 2004-158069, a relief circuit is arranged in a LOGIC macro outside a DRAM macro (FIG. 2) to be in parallel with an input/output bus (MUXOUT) between a DRAM macro and the LOGIC macro via a selector (FIG. 3).

In Japanese Patent Application Laid-open No. 2006-268970, a first relief bit register is arranged to be in parallel with a first read/write amplifier through a read/write bus connected to a DQ input/output buffer circuit.

However, because a relief storage cell is arranged in a sense amplifier array in the semiconductor memory device described in Japanese Patent Application Laid-open No. 2002-298596, a line-and-space value (L/S) for a transistor, a wiring, and a contact that constitute a relief storage cell has to coincide with a line-and-space value (L/S) for a transistor, a wiring, and a contact that constitute a sense amplifier to prevent an increase in the area of the memory cell array. Accordingly, the possibility that defects occur in the relief storage cell itself is increased. To relieve defects occurred in the relief storage cell, I/O redundant circuits can be used. However, causing defects in the circuit itself provided for relieving sporadic defective bits and increasing I/O buses to relieve such defects are not realistic.

Further, in the semiconductor memory device described in Japanese Patent Application Laid-open No. 2002-298596, because a relief storage cell is arranged within a memory cell array, a distance between a main amplifier (a circuit including a read amplifier and a write amplifier) and the relief storage cell is significantly extended depending on a position of a memory block. Respective distances from the main amplifier to the relief storage cells sporadically present in the memory block vary significantly. As a result, read margins and write margins of the respective relief storage cells are different from each other from view of the main amplifier, and thus a timing of operating of the main amplifier and the relief storage cell has to be changed depending on the position of the memory block. This complicates control of the device significantly.

Moreover, in the semiconductor memory device described in Japanese Patent Application Laid-open No. 2002-298596, the distance from a main amplifier to a relief storage cell is extended. Thus, when a sense amplifier is to be connected to the main amplifier by a hierarchized data bus (for example, a lower local I/O line and a higher main I/O line), contact resistances between multi-hierarchies deteriorate a time constant of the hierarchized data bus with large parasitic capacitance. As a result, a difference in access margin depending on the position of the memory block becomes further significant.

According to the semiconductor memory device described in Japanese Patent Application Laid-open No. 2008-71407, the relief storage cell is connected to an output terminal of a read amplifier and an input terminal of a write amplifier. Therefore, the number of components required for connecting to a relief storage cell is large and thus control of the device becomes complicated.

SUMMARY

The present invention seeks to solve one or more of the above problems, or to improve upon those problems at least in part.

In one embodiment, there is provided a semiconductor memory device comprising: a memory cell array including a plurality of memory cells and a plurality of sense amplifiers that performs data communication with the memory cells; a read amplifier that is provided outside the memory cell array and amplifies data read from one of the memory cells via one of the sense amplifiers; a write amplifier that is provided outside the memory cell array and amplifies data to be written in one of the memory cells via one of the sense amplifiers; and a relief storage cell that is provided outside the memory cell array and connected to an input terminal of the read amplifier and an output terminal of the write amplifier via a first switch.

In another embodiment, there is provided a semiconductor memory device comprising: a plurality of memory cells; a plurality of sense amplifiers each connected to any of the memory cells; a plurality of first data buses each connected to any of the sense amplifiers via respective column switches; a plurality of second data buses each connected to any of the first data buses via respective sub-amplifiers; a plurality of main amplifiers each connected to an associated one of the second data buses and amplify data on the second data bus; a plurality of relief storage cells each connected to an associated one of the second data buses via respective relief switches; and an address comparison circuit that turns on the relief switches in response to an access request to a predetermined address including an X address and a Y address.

In still another embodiment, there is provided a semiconductor memory device comprising: a plurality of memory cells; a plurality of sense amplifiers each connected to any of the memory cells; a hierarchized data bus that performs data communication with the memory cells, the hierarchized data bus including at least a first data bus assigned to a first hierarchized layer and a second data bus assigned to a second hierarchized layer; a memory cell array including the memory cells, the sense amplifiers, and the first hierarchized data bus and the second hierarchized data bus; a read amplifier that is arranged outside the memory cell array and receives an output signal of the sense amplifiers via the first and second hierarchized data buses; a relief storage cell that is arranged outside the memory cell array and connected to an input terminal of the read amplifier via a relief switch; and an address comparison circuit that turns on the relief switch in response to an access request to a predetermined address including an X address and a Y address, wherein a line-and-space value (L/S) for a transistor, a wiring, and a contact of the relief storage cell is larger than a line-and-space value (L/S) for a transistor, a wiring, and a contact of the sense amplifier.

As described above, in the semiconductor memory device according to the present invention, a relief storage cell is connected to an input terminal of a read amplifier. Therefore, the timing of operating a main amplifier and the relief storage cell does not need to be changed depending on a position of a memory block. Further, the number of components required for connecting to the relief storage cell can be minimized. Further, because the relief storage cell can be arranged in an area different from a memory cell array, a line-and-space value (L/S) for a transistor, a wiring, and a contact that constitute the relief storage cell does not need to coincide with a line-and-space value (L/S) for a transistor, a wiring, and a contact that constitute a sense amplifier, and the possibility of defects occurred in the relief storage cell itself is significantly decreased.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

A representative example of the concept for solving the problem of the present invention is described below.

Data buses connecting memory cells arranged in a memory cell array to main amplifiers arranged outside the memory cell array have a hierarchized structure, and a relief storage cell arranged outside the memory cell array is connected directly to, for example, a data bus on the highest hierarchy in the hierarchized data bus for input/output in/from the memory cell array. A line-and-space value for a transistor, a wiring, and a contact that constitute the relief storage cell is designed to be larger than that for a transistor, a wiring, and a contact that constitute the sense amplifier in the memory cell array. The relief storage cell is connected to an input terminal of a read amplifier and an output terminal of a write amplifier that constitute a main amplifier.

Preferred embodiments of the present invention will be explained below in detail with reference to the accompanying drawings.

Figure 1:
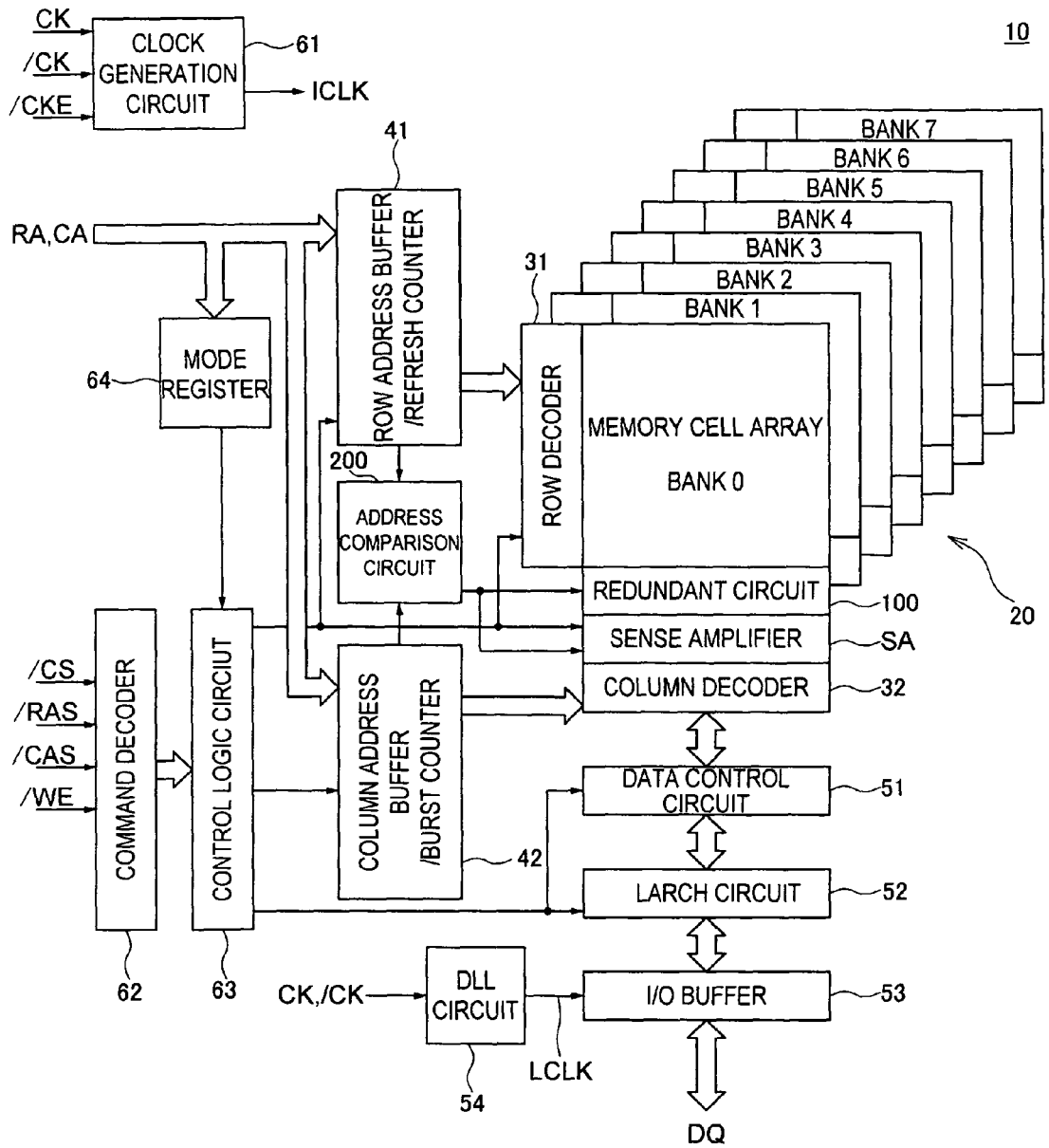
FIG. 1 is a block diagram of a semiconductor memory device 10 according to an embodiment of the present invention.

FIG. 1 is a block diagram of a semiconductor memory device 10 according to an embodiment of the present invention. While the semiconductor memory device 10 according to the present embodiment is a DRAM, the present invention is not limited thereto. FIG. 1 is an explanatory diagram of a relationship of connection between blocks constituting the semiconductor memory device 10, and FIG. 1 does not show any layout.

As shown in FIG. 1, the semiconductor memory device 10 according to the present embodiment includes a memory cell array 20 formed of banks 0 to 7, a row decoder 31 that performs row selection upon the memory cell array 20, and a column decoder 32 that performs column selection upon the memory cell array 20.

Row addresses RA are supplied from a row address buffer/refresh counter 41 to the row decoder 31. The row decoder 31 selects word lines included in the memory cell array 20 based on the row addresses RA. Column addresses CA are supplied from a column address buffer/burst counter 42 to the column decoder 32. The column decoder 32 selects bit lines included in the memory cell array 20 based on the column addresses CA. Memory cells corresponding to the row address RA and the column address CA are thus selected, and the selected memory cells are connected to a data control circuit 51. The memory cell is connected to the data control circuit 51 via a hierarchized data bus (a lower local I/O line and a higher main I/O line) to be described later. The data control circuit 51 is connected to a data input/output terminal DQ via a latch circuit 52 and an I/O buffer 53. Internal clocks LCLK are supplied to the I/O buffer 53 from a DLL circuit 54. The timing of data output is synchronized with the internal clocks LCLK.

In addition, the semiconductor memory device 10 includes a clock generation circuit 61 that generates various internal clocks ICLK in response to reception of clock signals CK and /CK and clock enable signals CKE, a command decoder 62 that decodes commands (/CS, /RAS, /CAS, /WE), a control logic circuit 63 that generates various internal signals based on output of the command decoder 62, and a mode register 64 in which operation modes of the semiconductor memory device 10 or the like are set.

Further, the semiconductor memory device 10 according to the present embodiment includes a redundant circuit 100 that relieves sporadic bit defects and an address comparison circuit 200 that detects a request of an access to addresses to be relieved. As described later, the redundant circuit 100 has a plurality of relief storage cells, and when the address comparison circuit 200 detects a request of an access to an address to be relieved, a regular data path is blocked and instead the data control circuit 51 is connected to a relief storage cell. With this arrangement, sporadic bit defects are relieved. The address comparison circuit 200 includes an address storage circuit that stores defective addresses. As for the address storage circuit, an electrically writable non-volatile storage circuit (for example, an anti-fuse circuit) is used, so that defective addresses can be written even after the semiconductor memory device 10 is packaged.

Figure 2:
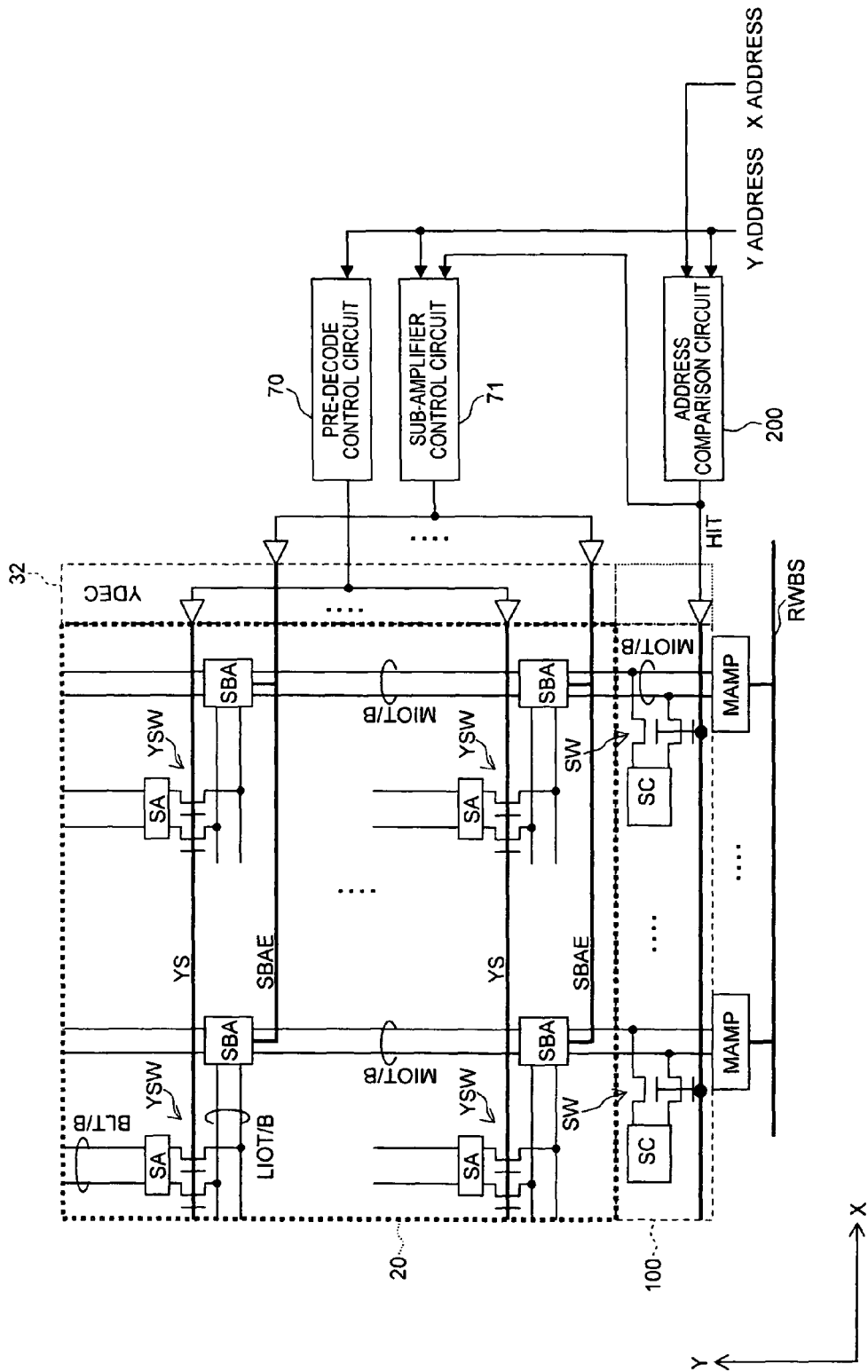
FIG. 2 is a diagram showing a circuit configuration of principal parts of the semiconductor memory device 10.

FIG. 2 shows a circuit configuration of principal parts of the semiconductor memory device 10.

As shown in FIG. 2, bit line pairs BLT/B arranged in a Y direction, local I/O line pairs LIOT/B (first data bus) arranged in a X direction, and main I/O line pairs MIOT/B (second data bus) arranged in the Y direction are formed in the memory cell array 20. The bit line pairs BLT/B, the local I/O line pairs LIOT/B, and the main I/O line pairs MIOT/B are formed on a different wiring layer. For example, the local I/O line pairs LIOT/B are wired in a layer above the bit line pairs BLT/B, and the main I/O line pairs MIOT/B are wired in a layer further above the local I/O line pairs LIOT/B.

Figure 9:
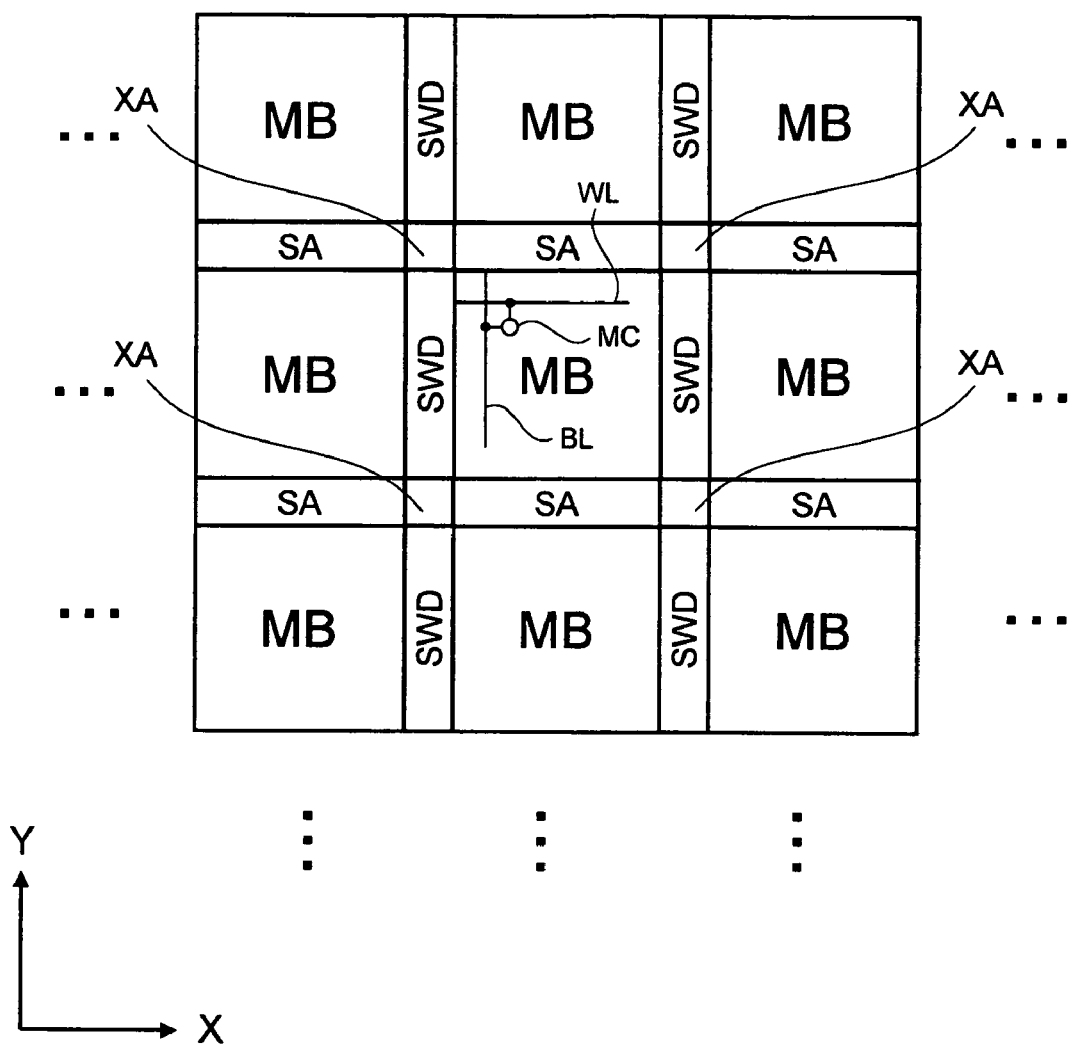
FIG. 9 is a circuit diagram showing memory blocks MB in a memory cell array 20.

The memory cell array 20 is divided into a plurality of memory blocks MB laid out in a matrix as shown in FIG. 9. A sub-word driver SWD is arranged between the memory blocks MB adjacent to each other in the X direction, and word lines (extending in the X direction) in the memory block MB are selected thereby. A sense amplifier SA and a column switch YSW (not shown) are arranged between the memory blocks MB adjacent to each other in the Y direction, and bit lines (extending in the Y direction) in the memory block MB are driven thereby. Accordingly, the memory block MB is a unit for sharing the same sub-word driver SWD and the same sense amplifier SA. Different local I/O line pairs LIOT/B are assigned to the respective memory blocks MB. The bit line pair is arranged in the memory block MB in a lower conductive layer. The local I/O line is arranged in an area where a sense amplifier array is provided in a middle conductive layer, and the main I/O line is arranged in an area where a sub-word driver array is provided in a higher conductive layer. In this way, a configuration of the hierarchized data bus is disclosed. However, the configuration of the data bus is not limited thereto, and the main I/O line can be arranged to pass the memory block MB area, for example.

Figure 3:
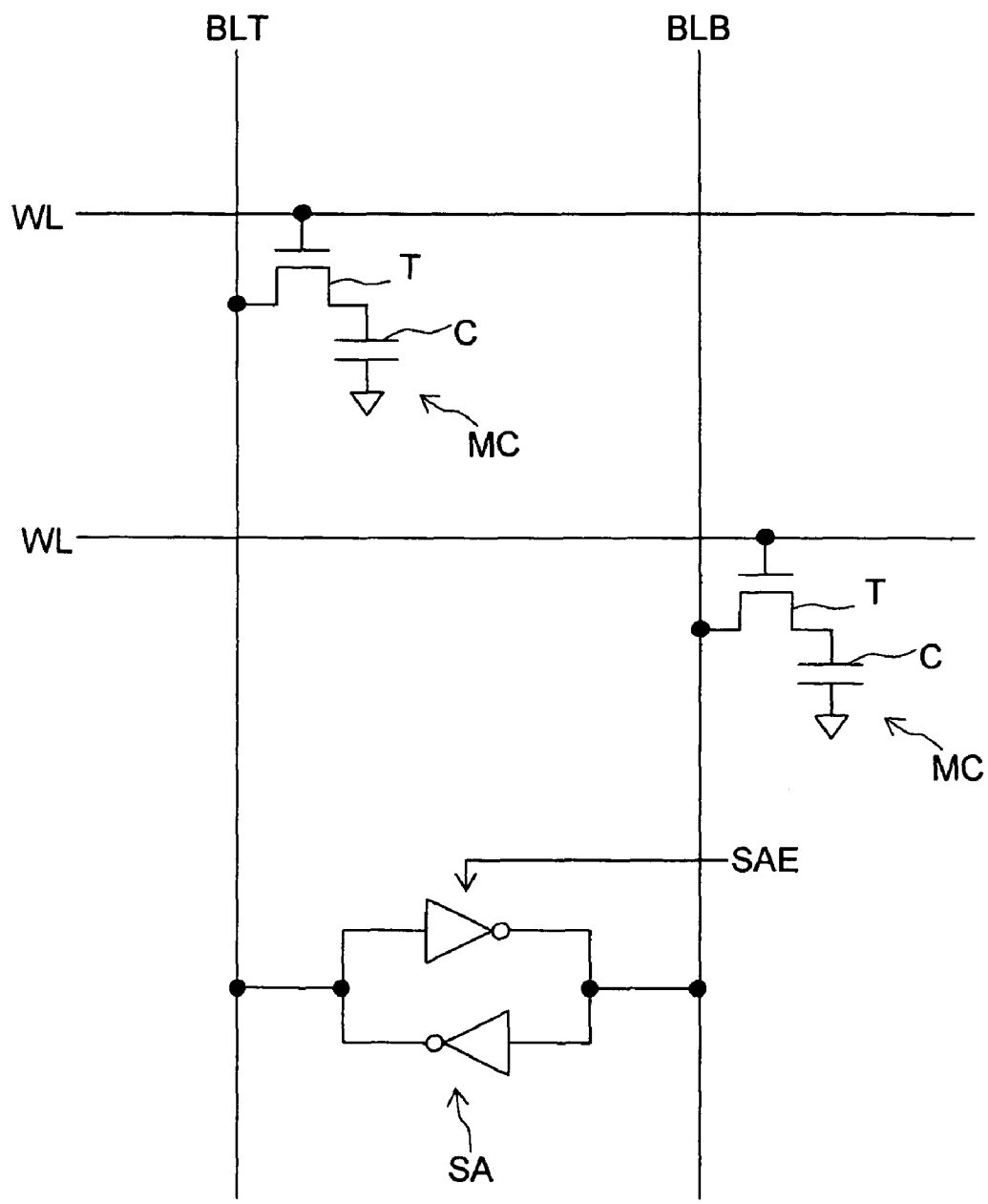
FIG. 3 is a circuit diagram showing a sense amplifier SA and a memory cell MC.

The memory cells MC are connected to the bit line pair BLT/B as shown in FIG. 3, and a potential difference generated in the bit line pair BLT/B through an access is amplified by the sense amplifier SA. That is, the sense amplifier SA performs data communication with the memory cell MC. The memory cell MC is accessed by activating a corresponding word line WL. The word line WL is activated by the row decoder 31 shown in FIG. 1. The memory cell MC is a serial circuit of a cell transistor T and a cell capacitor C. A gate of the cell transistor T is connected to the corresponding word line WL and a source/drain of the cell transistor T is connected to a corresponding one of a bit line BLT or a bit line BLB. The sense amplifier SA has a configuration of a voltage differential amplifier circuit and is activated in response to a sense amplifier activation signal SAE.

Input/output nodes of the sense amplifier SA are connected to a corresponding local I/O line pair LIOT/B via the column switch YSW as shown in FIG. 2. The column switch YSW is controlled by a column select signal YS generated by a pre-decode control circuit 70 that receives a part of the column addresses CA. With this arrangement, a part of the sense amplifiers SA selected by the column addresses CA are connected to the local I/O line pairs LIOT/B.

As shown in FIG. 2, the local I/O line pair LIOT/B is connected to a corresponding main I/O line pair MIOT/B via the sub-amplifier SBA (second switch). The sub-amplifier SBA is controlled by a sub-amplifier control signal SBAE that serves as an output of a sub-amplifier control circuit 71. The sub-amplifier SBA is arranged at a cross area XA of the row of the sub-word drivers SWD extending in the Y direction with the row of the sense amplifiers SA extending in the X direction (see FIG. 9). An arrangement pitch of the sub-amplifiers SBA is thus equal to that of the memory blocks MB. Details of the sub-amplifier SBA are described later.

The sub-amplifier control circuit 71 is a circuit that generates the sub-amplifier control signal SBAE by a part of the column addresses CA. Some local I/O line pairs LIOT/B selected by the column addresses CA are connected to the main I/O line pairs MIOT/B.

The main I/O line pairs MIOT/B are connected to corresponding main amplifiers MAMP. That is, the main amplifier MAMP performs input/output with respect to the memory cell array 20. (On the other hand, the sense amplifier is an amplifier that performs input/output with respect to one memory block MB in the memory cell array 20, and the sub-amplifier is an amplifier that performs input/output with respect to the plural memory blocks MB in the memory cell array 20.) The main amplifier MAMP is provided outside the memory cell array 20 (preferably at an area near an entrance and exit of the main I/O line extended from the memory cell array and adjacent or close to one side of the memory cell array), and includes a read amplifier that converts differential read data into data of single end format by amplification and a write amplifier that converts write data of single end format into data of differential format by amplification. An output of a read amplifier included in the main amplifier MAMP is supplied to a read/write bus RWBS. Write data on the read/write bus RWBS is inputted to a write amplifier included in the main amplifier MAMP. The read/write bus RWBS is connected to an input/output circuit (not shown) connected to an external data terminal.

As shown in FIG. 2, the redundant circuit 100 is located outside the memory cell array 20 and between the memory cell array 20 and the main amplifier MAMP so as to be along one side of the memory cell array 20. The redundant circuit 100 includes a plurality of relief storage cells SC and the relief storage cells SC are connected to corresponding main I/O line pairs MIOT/B via switches SW (first switches). That is, one relief storage cell SC is assigned to one main I/O line pair MIOT/B.

As shown in FIG. 2, the relief storage cell SC and the main amplifier MAMP are arranged at the area along the same side of the memory cell array 20. Further, the relief storage cell SC is arranged to be adjacent to the main amplifier MAMP and the address comparison circuit 200 (described later). The relief storage cells SC connected to the main I/O line pairs MIOT/B are arranged at an area along the same side as the side along which the main amplifiers MAMP are arranged despite of relieving any defects of memory cells in the memory blocks. On the other hand, according to the sub-amplifiers SBA connected to the main I/O line pairs MIOT/B, a distance between the sub-amplifier SBA and the main amplifier MAMP varies depending on a position that a corresponding memory block is arranged.

As shown in FIG. 2, a wiring distance from the address comparison circuit 200 to the switch SW (first switch) is shorter than a wiring distance from the sub-amplifier control circuit 71 (control circuit) to the sub-amplifier SBA (second switch). This means the following fact that the sub-amplifiers SBA are provided in a sporadic manner in the X direction and the Y direction of the memory cell array 20. Meanwhile, the sub-amplifier control circuit 71 that controls the sub-amplifiers SBA is arranged outside the memory cell array 20 (along one side of the memory cell array 20). Thus, the total length of an extending output signal line of the sub-amplifier control circuit 71 is "length of X side+length of Y side" of the memory cell array 20 at maximum. The total number of loads of the sub-amplifier control circuit 71 (the total number of the sub-amplifiers SBA) is equal to the total number of memory blocks (one memory block bases on a plurality of memory cells and a plurality of sense amplifiers) and larger than the number of loads of the address comparison circuit 200 (=the number of rows of memory blocks). Because the relief storage cell SC is adjacent to the main amplifier MAMP arranged outside the memory cell array 20 and along one side thereof, it is arranged only outside the memory cell array 20 and along one side thereof (outside the memory cell array 20 and along the same side as the side along which the main amplifier MAMP is arranged). The address comparison circuit 200 is also arranged along the same side or adjacent thereto. Accordingly, the total length of extending output signal line of the address comparison circuit 200 is "length of X side of the memory cell array 20 or length of the X side−length of side of the memory block" at maximum. Such a difference in the wiring length in addition to the above-mentioned difference in the number of loads means that the relief storage cell SC can perform faster data communication with the main amplifier MAMP, and properties of the relief storage cell SC are superior to those of Japanese Patent Application Laid-open No. 2002-298596.

Figure 4:
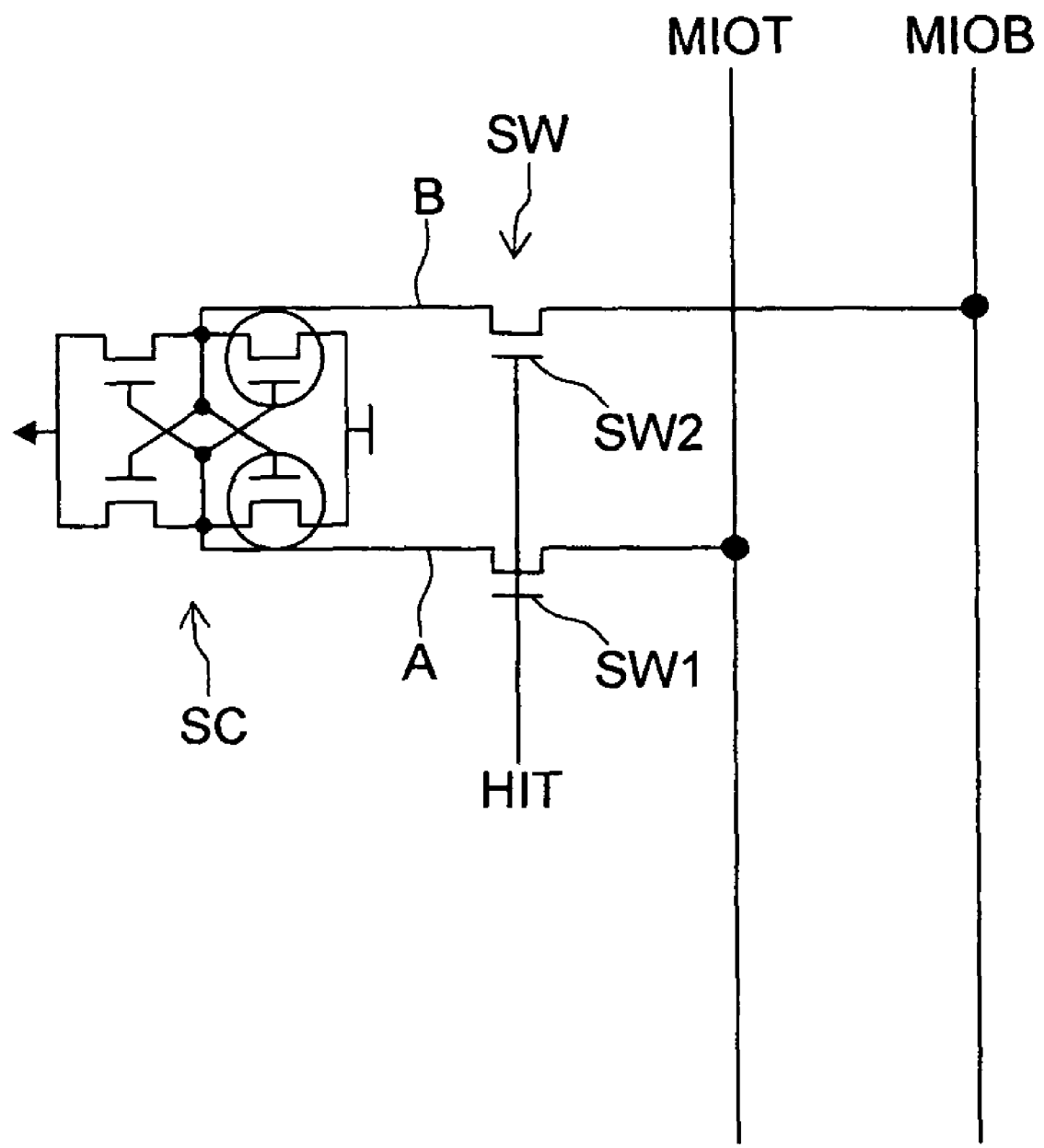
FIG. 4 is a circuit diagram of the relief storage element SC.

FIG. 4 is a circuit diagram of the relief storage cell SC.

As shown in FIG. 4, the relief storage cell SC has a configuration of a flip-flop circuit. One input/output node A is connected to the main I/O line MIOT via a switch SW1 and the other input/output node B is connected to the main I/O line MIOB via a switch SW2. A hit signal HIT that serves as an output of the address comparison circuit 200 is supplied to gates of the switches SW1 and SW2. When the hit signal HIT is activated, the switch SW (SW1 and SW2) is turned on, so that the main I/O line pair MIOT/B is connected to the relief storage cell SC. It suffices that the relief storage cell SC has at least a flip-flop circuit configuration.

The hit signal HIT that serves as an output of the address comparison circuit 200 is also supplied to the sub-amplifier control circuit 71. The sub-amplifier control circuit 71 prohibits activation of the sub-amplifier control signal SBAE when the hit signal HIT is activated. All sub-amplifiers SBA are thus turned off. This is because when the main I/O line pair MIOT/B is connected to both the local I/O line pair LIOT/B and the relief storage cell SC, data collision occurs and bit defects cannot be relieved properly.

Figure 5:
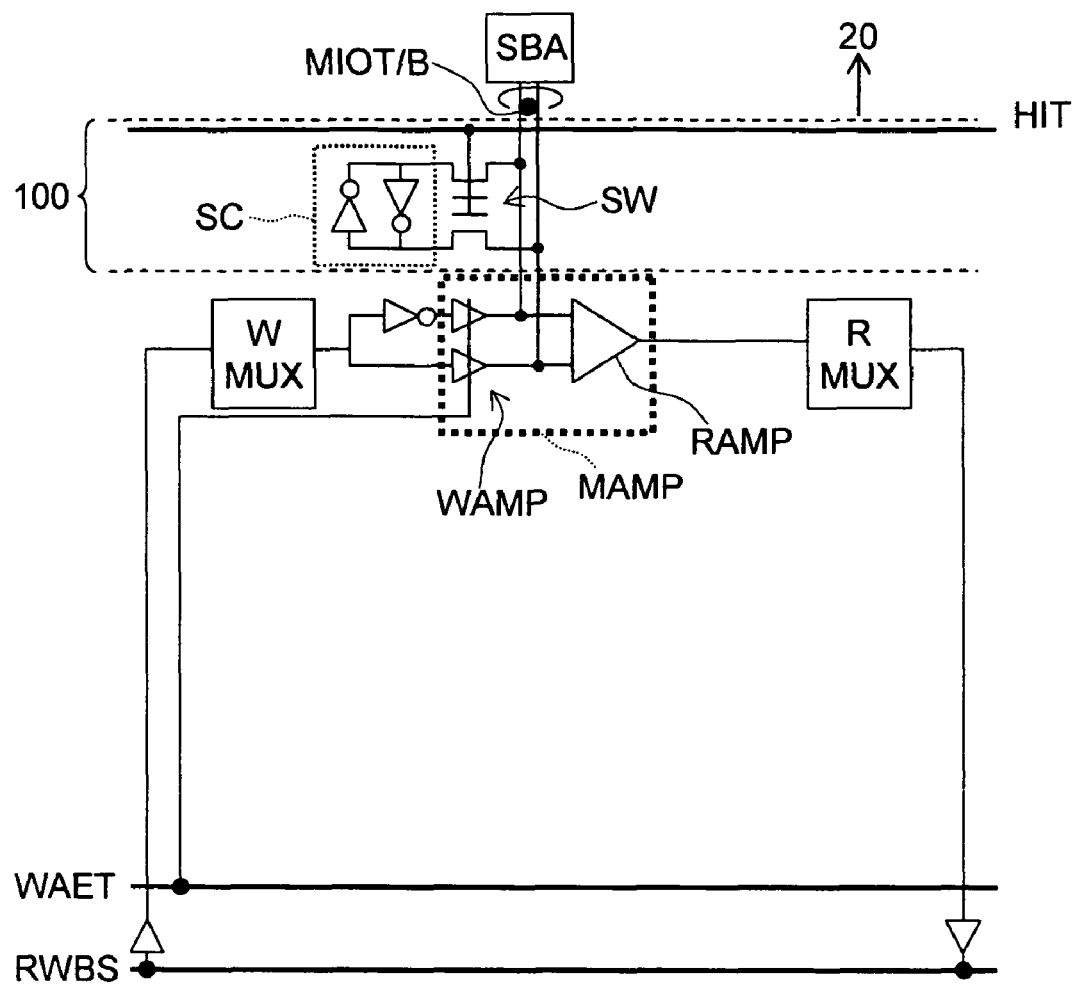
FIG. 5 is a diagram showing a circuit configuration of the principal parts of the circuit shown in FIG. 2 in more detail.

FIG. 5 shows a circuit configuration of the principal parts of the circuit shown in FIG. 2 in more detail.

As shown in FIG. 5, the main I/O line pair MIOT/B connects the sub-amplifier SBA arranged within the memory cell array 20 to the main amplifier MAMP arranged outside the memory cell array 20. A line-and-space value (L/S) of inside of the memory cell array 20 (the sub-word driver, the sense amplifier, the sub-amplifier, and the cross area XA) is set to be relatively small (=LS1) to enhance the integration degree. On the other hand, a line-and-space value (L/S) of outside of the memory cell array 20 is set to be relatively large (=LS2) so that defects hardly occur, because if detects occur there, they cannot be relieved by the redundant circuit. That is, LS1<LS2 is established. The line-and-space value (L/S) indicates lines and spaces of a transistor, a wiring, and a contact.

In the present embodiment, because the relief storage cell SC is arranged outside the memory cell array 20, the line-and-space value (LS2) is designed to be relatively large. Thus, as compared to a case of arranging the relief storage cell SC within the memory cell array 20, defects hardly occur in the relief storage cell SC itself. Accordingly, it is not necessary to provide any circuit (I/O redundant circuit or the like) for a case that defects are generated in the relief storage cell SC.

As shown in FIG. 5, the main I/O line pair MIOT/B is connected to an input terminal of the read amplifier RAMP included in the main amplifier MAMP and also connected to an output terminal of the write amplifier WAMP included in the main amplifier MAMP. The write amplifier WAMP supplies write data on the read/write bus RWBS to the main I/O line pair MIOT/B when a write enable signal WAET is activated, and is arranged outside the memory cell array 20 similarly to the read amplifier RAMP. A write multiplexer WMUX is located between the read/write bus RWBS and the write amplifier WAMP and performs selection depending on the column address CA and so on (not shown). Similarly, a read multiplexer RMUX is located between the read amplifier RAMP and the read/write bus RWBS and performs selection depending on the column address CA and soon. The relief storage cell SC provided at an area adjacent to or close to one side of the memory cell array is arranged at a position capable of achieving best electric properties of the read amplifier RAMP and the write amplifier WAMP. With this arrangement, problems about electric properties such as timing margins caused by delays in operation speed of a known redundant circuit or in activation operation speed of a redundant circuit do not occur.

Figure 6:
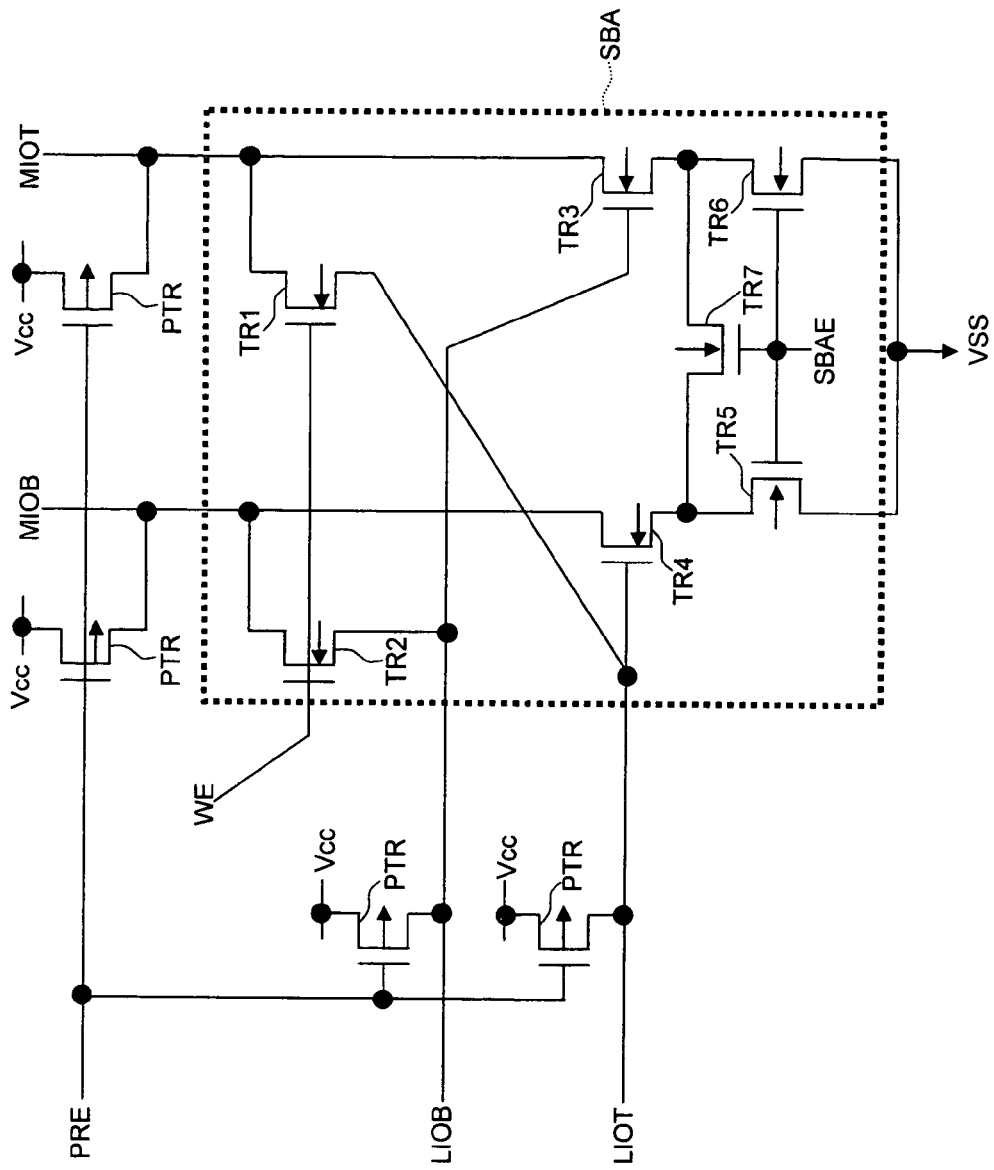
FIG. 6 is a circuit diagram of the sub-amplifier SBA.

FIG. 6 is a circuit diagram of the sub-amplifier SBA.

As shown in FIG. 6, the sub-amplifier SBA includes a transistor TR1 that connects the local I/O line LIOT to the main I/O line MIOT and a transistor TR2 that connects the local I/O line LIOB to the main I/O line MIOB. A write enable signal WE is supplied to gates of the transistors TR1 and TR2. Thus, when the write enable signal WE is activated, the main I/O line pair MIOT/B and the local I/O line pair LIOT/B are short-circuited, so that the write data on the main I/O line pair MIOT/B is supplied to the local I/O line pair LIOT/B.

Further, the sub-amplifier SBA includes a transistor TR3 whose gate is connected to the local I/O line LIOB and whose drain is connected to the main I/O line MIOT, a transistor TR4 whose gate is connected to the local I/O line LIOT and whose drain is connected to the main I/O line MIOB, and enable transistors TR5 to TR7 that connect sources of the transistors TR3 and TR4 to a ground potential VSS. The sub-amplifier control signal SBAE is supplied to gates of the transistors TR5 to TR7. When the sub-amplifier control signal SBAE is activated, the read data on the local I/O line pair LIOT/B is amplified and supplied to the main I/O line pair MIOT/B. That is, the sub-amplifier SBA has a function of amplifying signals during read (voltage-current conversion function).

As shown in FIG. 6, precharge transistors PTR are connected to the main I/O line pair MIOT/B and the local I/O line pair LIOT/B. A precharge signal PRE is supplied commonly to gates of the precharge transistors PTR. When the precharge signal PRE is activated, the main I/O line pair MIOT/B and the local I/O line pair LIOT/B are precharged to a power supply potential. A so-called load type circuit for amplitude restriction utilizing a resistor instead of the precharge transistor PTR can be used.

A plurality of sub-amplifiers SBA are provided for one main I/O line pair MIOT/B. The local I/O line pairs LIOT/B are wired-OR connected to one main I/O line pair MIOT/B. Control of wired-OR is performed by an address (included in an X address or a Y address; not shown) indicating the arrangement of the memory block MB inputted to the sub-amplifier control circuit 71 shown in FIG. 2. Meanwhile, one local I/O line pair LIOT/B is selected for one main I/O line pair MIOT/B.

Figure 7:
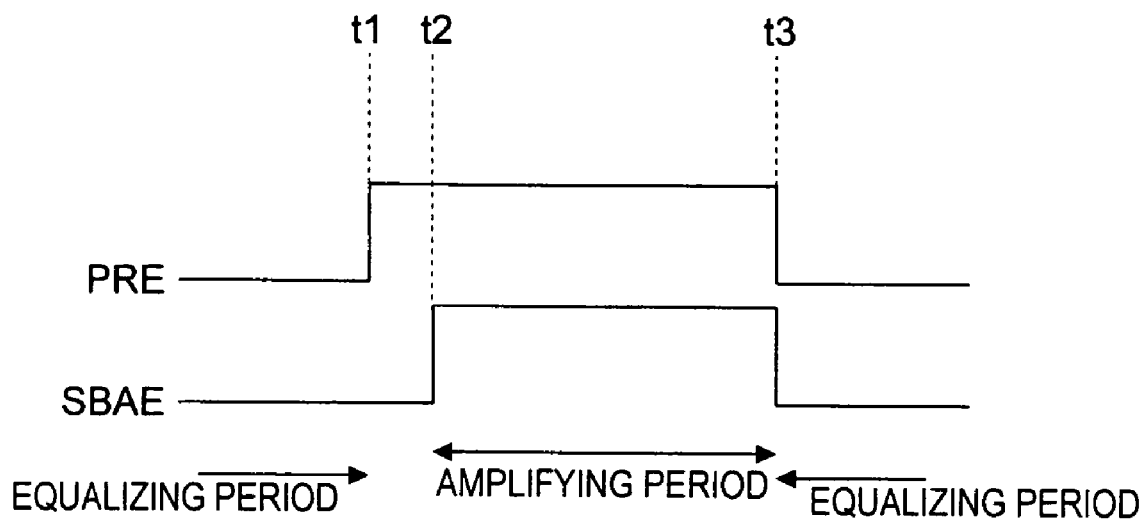
FIG. 7 is a timing diagram showing an operation of the sub-amplifier SBA.

FIG. 7 is a timing diagram showing an operation of the sub-amplifier SBA.

As shown in FIG. 7, the precharge signal PRE is activated at a low level during an equalizing period, so that the main I/O line pair MIOT/B and the local I/O line pair LIOT/B are equalized to the power supply potential. The precharge signal PRE is then inactivated to a high level at a time t1 and the sub-amplifier control signal SBAE is activated to a high level at a time t2. The read data on the local I/O line pair LIOT/B is thus amplified and supplied to the main I/O line pair MIOT/B. At a time t3, the sub-amplifier control signal SBAE and the precharge signal PRE return to a low level again and the main I/O line pair MIOT/B and the local I/O line pair LIOT/B are equalized to the power supply potential. As for the power supply potential to be equalized, any voltage can be selected.

Figure 8:
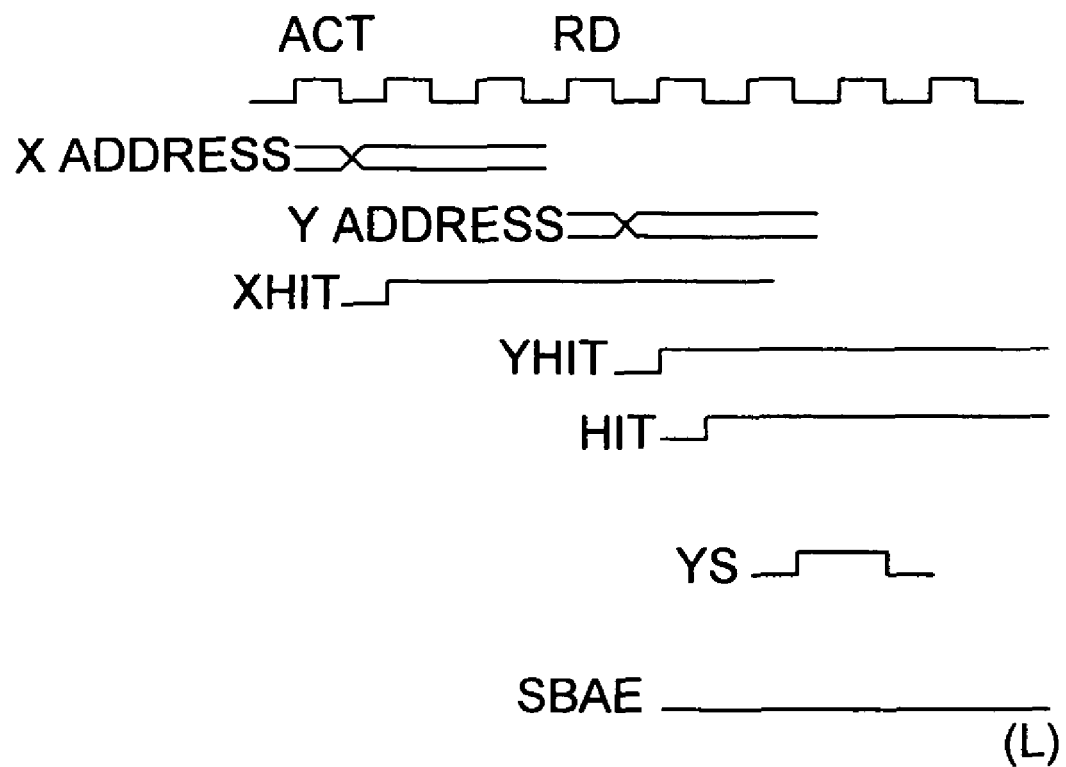
FIG. 8 is a timing diagram showing an operation when a request for an access to an address to be relieved is detected by the address comparison circuit 200.

FIG. 8 is a timing diagram showing an operation when a request for an access to an address to be relieved is detected by the address comparison circuit 200.

As shown in FIG. 8, when an X address (row address) is inputted in synchronization with an active command (ACT) and then a Y address (column address) is inputted in synchronization with a read command (RD), the semiconductor memory device 10 performs a read operation upon the memory cells MC corresponding to these addresses. When the X address is an address to be relieved, such a state is detected by the address comparison circuit 200 and a hit signal XHIT that serves as an internal signal is activated. Further, when the Y address is an address to be relieved, such a state is detected by the address comparison circuit 200 and a hit signal YHIT that serves as the internal signal is activated. When these hit signals XHIT and YHIT are activated, the address comparison circuit 200 activates the hit signal HIT.

Thereafter, the column select signal YS is activated and the column switch YSW is thus turned on. Because the hit signal HIT is activated, however, the sub-amplifier control signal SBAE is not activated. Accordingly, the main I/O line pair MIOT/B is not driven by the sub-amplifier SBA. Instead, as the switch SW included in the redundant circuit 100 is turned on in response to the activation of the hit signal HIT, the main I/O line pairs MIOT/B are connected to the corresponding relief storage cells SC. Thus, read data read from the relief storage cells SC, not read data read from the memory cell array 20, is supplied to the read/write bus RWBS, thereby relieving defective bits.

As described above, according to the present embodiment, because the relief storage cell SC is arranged outside the memory cell array 20, the line-and-space value (LS2) for a transistor, a wiring, and a contact that constitute the relief storage cell SC can be designed to be larger than the line-and-space value (LS1) for a transistor, a wiring, and a contact that constitute the sense amplifier SA within the memory cell array 20. Accordingly, defects hardly occur in the relief storage cell SC itself.

Further, because the relief storage cell SC is connected to the input terminal of the read amplifier RAMP and the output terminal of the write amplifier WAMP, only the switch SW (=SW1+SW2) is required for one relief storage cell SC. Therefore, the number of components can be reduced significantly as compared to a case of connecting the relief storage cell SC to the output terminal of the read amplifier RAMP and the input terminal of the write amplifier WAMP.

In the present embodiment, the data bus that connects the memory cell in the memory cell array 20 to the main amplifier MAMP outside the memory cell array 20 has a hierarchized structure and the relief storage cell SC is connected directly to a data bus in a hierarchy of inputting/outputting to and from the memory cell array 20 (for example, the main I/O line pair MIOT/B that serves as the data bus on the highest layer). Therefore, the timing of switching on the switch SW does not need to be changed depending on the position of the memory cell MC to be replaced in the memory cell array 20. Accordingly, the redundant circuit 100 is easily controlled.

It is apparent that the present invention is not limited to the above embodiments, but may be modified and changed without departing from the scope and spirit of the invention.

For example, in the above embodiment, a flip-flop circuit is used as the relief storage cell SC; however, as far as it is a storage element capable of holding data in a static manner, other storage elements such as a register can be used.

The semiconductor memory device according to the present invention includes a semiconductor device such as CPU (Central Processing Unit), MCU (Micro Control Unit), DSP (Digital Signal Processor), ASIC (Application Specific Integrated Circuit), or ASSP (Application Specific Standard Circuit) that has an information storage function. Further, the device to which the present invention is applied is applicable to semiconductor devices such as SOC (System on Chip), MCP (Multi Chip Package), and POP (Package on Package).

What is claimed is:

1. A semiconductor memory device comprising:
    a plurality of memory cells;
    true and complementary main I/O lines;
    a read/write bus;
    a main amplifier comprising a read amplifier that includes first and second input nodes respectively coupled to the true and complementary main I/O lines and a first output node coupled to the read/write bus, and a write amplifier that includes a third input node coupled to the read/write bus and second and third output nodes coupled respectively to the true and complementary main I/O lines, the read amplifier being activated, in a data read mode, to respond to a potential difference between the true and complementary main I/O lines and drive the read/write bus, and the write amplifier being activated, in a data write mode, to respond to a data signal on the read/write bus and drive the true and complementary main I/O lines;

a relief storage cell; and
a control circuit configured to electrically connect the true and complementary main I/O lines to one of the memory cells with an intervention of a sense amplifier when an access address is inconsistent with a defective address and to the relief storage cell without an intervention of a sense amplifier when the access address is coincident with the defective address, so that, in the data read mode, the read amplifier drives the read/write bus in response to the potential difference between the true and complementary main I/O lines caused by data stored in the one of the memory cells when the access address is inconsistent with the defective address and by data stored in the relief storage cell when the access address is coincident with the defective address, and in the data write mode, data on the read/write bus is written, by the write amplifier driving the true and complementary main I/O lines, into the one of the memory cells when the access address is inconsistent with the defective address and into the relief storage cell when the access address is coincident with the defective address.

2. The semiconductor memory device as claimed in claim 1, wherein the relief storage cell is different in type from each of the memory cells.

3. The semiconductor memory device as claimed in claim 1, wherein the relief storage cell comprises a flip-flop circuit including first and second input/output nodes, and the control circuit comprises first and second switches, the first switch being connected between the true main I/O line and the first input/output node of the flip-flop circuit, the second switch being connected between the complementary main I/O line and the second input/output node of the flip-flop circuit, and each of the first and second switches being turned ON conductive when the access address is coincident with the defective address.

4. The semiconductor memory device as claimed in claim 3, wherein the memory cells are arranged in a matrix including a plurality of rows and columns, the access address comprising a row address and a column address, the defective address comprising a row defective address and a column defective address, and each of the first and second switches being turned ON when the row address is coincident with the row defective address and the column address is coincident with the column defective address.

5. A semiconductor memory device comprising:
a plurality of memory cells arranged in a matrix including a plurality of rows and columns, a part of the memory cells being designated as selected memory cells in response to row address information of an access address;
a plurality of sense amplifiers each operatively connected to an associated one of the selected memory cells;
a local I/O line;
a plurality of column switches each operatively connecting a selected one of the sense amplifiers to the local I/O line in response to column address information of the access address;
a main I/O line;
a sub-amplifier operatively connecting the local I/O line to the main I/O line;
a read/write bus;
a main amplifier comprising a read amplifier that includes a first input node coupled to the main I/O line and a first output node coupled to the read/write bus, and a write amplifier that includes a second input node coupled to the read/write bus and a second output node coupled to the main I/O line, the read amplifier being activated, in a data read mode, to respond to a potential on the main I/O line and drive the read/write bus, and the write amplifier being activated, in a data write mode, to respond to a data signal on the read/write bus and drive the main I/O line;
a redundant circuit comprising a relief storage cell and a switch circuit coupled between the relief storage cell and the main I/O line; and
a control circuit activating the sub-amplifier and turning the switch OFF when the access address is inconsistent with a defective address and deactivating the sub-amplifier and turning the switch ON when the access address is coincident with the defective address so that data read and write operations are performed on at least one of the selected memory cells by the read and write amplifiers of the main amplifier when the access address is inconsistent with the defective address and on the relief storage cell by the read and write amplifiers of the main amplifier when the access address is coincident with the defective address and on the relief storage cell.

6. The semiconductor memory device as claimed in claim 5, wherein the local I/O line runs in a first direction, and the main I/O line runs elongated in a second direction that is substantially perpendicular to the first direction, the sub-amplifier being disposed at an intersection of the local and main I/O lines, the main I/O line being elongated beyond the redundant circuit and reaching the main amplifier so that each of the relief storage cell and the switch intervenes between the sub-amplifier and the main amplifier.

7. The semiconductor memory device as claimed in claim 6, wherein the redundant circuit includes a control line that is connected to the switch circuit to control ON and OFF states of the switches under a control of the control circuit, the control line running in the second direction between the sub-amplifier and the main amplifier.

8. The semiconductor memory device as claimed in claim 6, wherein the read/write bus runs in the first direction to sandwich the main amplifier between the redundant circuit and the read/write bus.

9. The semiconductor memory device as claimed in claim 5, wherein the main I/O line comprises true and complementary main I/O lines, and the switch circuit comprises a first switch connected between the true main I/O line and a first input/output node of the relief storage cell and a second switch connected between the complementary main I/O line and a second input/output node of the relief storage cell.

10. A semiconductor memory device comprising:
a data line;
a memory cell that is electrically connected to the data line with an intervention of a sense amplifier when the memory cell is not defective and disconnected from the data line when the memory cell is defective;
a relief storage cell that is electrically connected to the data line without an intervention of a sense amplifier when the memory cell is defective and disconnected from the data line when the memory cell is not defective;
a data read/write bus;
a read amplifier that includes an input node coupled to the data line and an output node coupled to the data read/write bus to drive the data read/write bus in response to a potential on the data line so that the read amplifier reads out onto the data read/write bus data stored in the memory cell when the memory cell is not defective and data stored in the relief storage cell when the memory cell is defective; and a write amplifier that includes an input node coupled to the data read/write bus and an output node coupled to the data line to drive the data line in response to a potential on the data read/write bus so that the write amplifier writes data on the read/write bus into the memory cell when the memory cell is not defective and into the relief storage cell when the memory cell is defective.

11. The semiconductor memory device as claimed in claim 10, wherein the data line comprises true and complementary data lines, and the relief storage cell includes first and second input/output nodes that are electrically connected to the true and complementary data lines, respectively, when the memory cell is defective.

12. The semiconductor memory device as claimed in claim 11, wherein the memory cell comprises a DRAM cell and the relief storage cell comprises an SRAM cell.

* * * * *